US007973454B1

(12) United States Patent
Chen et al.

(10) Patent No.: US 7,973,454 B1
(45) Date of Patent: Jul. 5, 2011

(54) VACUUM HERMETIC ORGANIC PACKAGING CARRIER AND SENSOR DEVICE PACKAGE

(75) Inventors: Lung-Tai Chen, Kaohsiung County (TW); Tzong-Che Ho, Hsinchu (TW); Li-Chi Pan, Hsinchu County (TW); Yu-Wen Fan, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/850,643

(22) Filed: Aug. 5, 2010

(30) Foreign Application Priority Data

Jun. 4, 2010 (TW) .............................. 99118186 A

(51) Int. Cl.
*H01L 41/053* (2006.01)
(52) U.S. Cl. ....................................... 310/344; 310/348
(58) Field of Classification Search .................. 310/344, 310/348
See application file for complete search history.

(56) References Cited

U.S. PATENT DOCUMENTS

| 7,034,441 | B2 | 4/2006 | Ono et al. | |
|---|---|---|---|---|
| 7,351,609 | B2* | 4/2008 | Wu et al. | 438/106 |
| 2003/0201507 | A1* | 10/2003 | Chen et al. | 257/433 |
| 2003/0201535 | A1* | 10/2003 | Chen et al. | 257/738 |
| 2004/0012309 | A1 | 1/2004 | Kim et al. | |
| 2010/0072564 | A1* | 3/2010 | Saitoh et al. | 257/415 |
| 2010/0140734 | A1* | 6/2010 | Sato et al. | 257/503 |
| 2010/0244166 | A1* | 9/2010 | Shibuta et al. | 257/432 |

* cited by examiner

*Primary Examiner* — Thomas M Dougherty
(74) *Attorney, Agent, or Firm* — Jianq Chyun IP Office

(57) ABSTRACT

A vacuum hermetic organic packaging carrier and a sensor device package are provided. The organic packaging carrier includes an organic substrate, a conductive circuit layer, and an inorganic hermetic insulation film. The organic substrate has a first surface. The conductive circuit layer is located on the first surface and exposes a portion of the first surface. The inorganic hermetic insulation film at least covers the exposed first surface to achieve an effect of completely hermetically sealing the organic packaging carrier.

13 Claims, 7 Drawing Sheets

(1)

(2)

(1)

(2)

(1)

(2)

VACUUM HERMETIC ORGANIC PACKAGING CARRIER AND SENSOR DEVICE PACKAGE

CROSS-REFERENCE TO RELATED APPLICATION

This application claims the priority benefit of Taiwan application serial no. 99118186, filed on Jun. 4, 2010. The entirety of the above-mentioned patent application is hereby incorporated by reference herein and made a part of this specification.

BACKGROUND

1. Technical Field

The disclosure relates to a vacuum hermetic organic packaging carrier and a sensor device package.

2. Description of Related Art

In recent sensor packaging technology, the correlation between vibration damping of sensors and vibration frequency as well as a sensing signal-to-noise ratio is taken into account, so the sensors need to be driven under a high negative pressure environment. Therefore, power consumption caused by collision of gas molecules can be reduced, and then the quality factor of the motion sensors can be improved and the sensing signal-to-noise ratio can be increased. As such, a sensor device package should provide the sensor device a stable, high negative pressure environment. That is, gas leakage must be prevented, and the pressure environment in a sensing space in the sensor device package cannot be changed as time goes on. Accordingly, the design need of such a sensor device (e.g. a vibrator, a radio frequency switch, a gyroscope, and so on) must comply with a hermetic sealing requirement.

Low temperature co-fired ceramic (LTCC) carriers made of dense materials can well block gas and thus have been extensively applied to conventional sensor device packages satisfying the hermetic sealing requirement.

However, when the LTCC carrier is applied, each sensor device package needs to be formed individually.

SUMMARY

An organic packaging carrier including an organic substrate, a conductive circuit layer, and an inorganic hermetic insulation film is introduced herein. The organic substrate has a first surface. The conductive circuit layer is located on the first surface and exposes a portion of the first surface. The inorganic hermetic insulation film at least covers the exposed first surface to achieve an effect of hermetically sealing the organic packaging carrier.

A sensor device package structure is provided that includes the organic packaging carrier, a conductive cap, a sensor device, and a metal bonding material is further introduced herein. The conductive cap covers the first surface of the organic substrate to achieve the effect of hermetically sealing the organic packaging carrier and form a hermetic space. The sensor device is disposed in the hermetic space and electrically coupled to the conductive circuit layer. The metal bonding material is located between the organic substrate and the conductive cap to bond the organic substrate to the conductive cap.

Several exemplary embodiments accompanied with figures are described in detail to further describe the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1A:
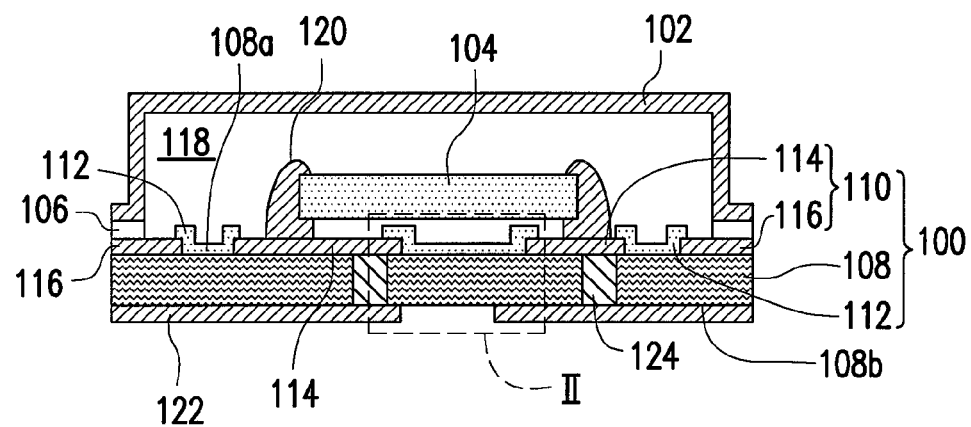
FIG. 1A is a schematic cross-sectional view illustrating a sensor device package according to a first exemplary embodiment of the disclosure.
Figure 1B:
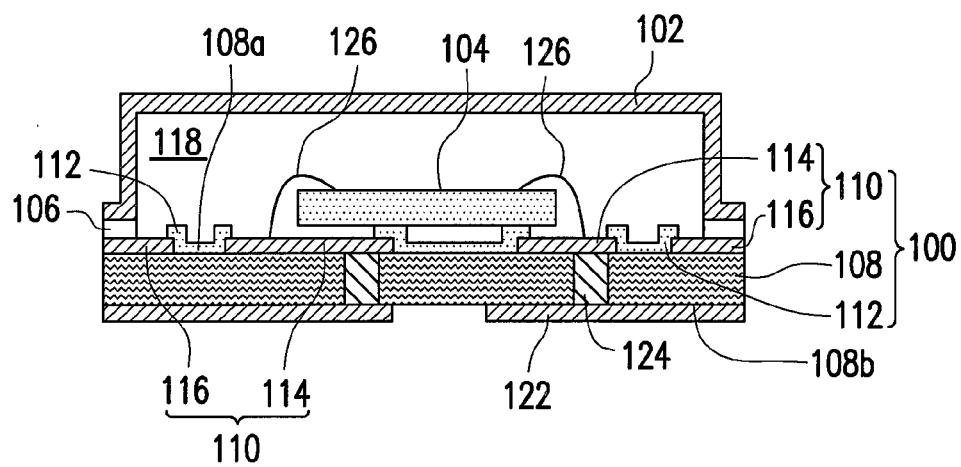
FIG. 1B is a schematic cross-sectional view illustrating another sensor device package according to the first exemplary embodiment of the disclosure.

FIG. 1A is a schematic cross-sectional view illustrating a sensor device package according to a first exemplary embodiment of the disclosure. FIG. 1B is a schematic cross-sectional view illustrating another sensor device package according to the first exemplary embodiment of the disclosure.

Figure 2:
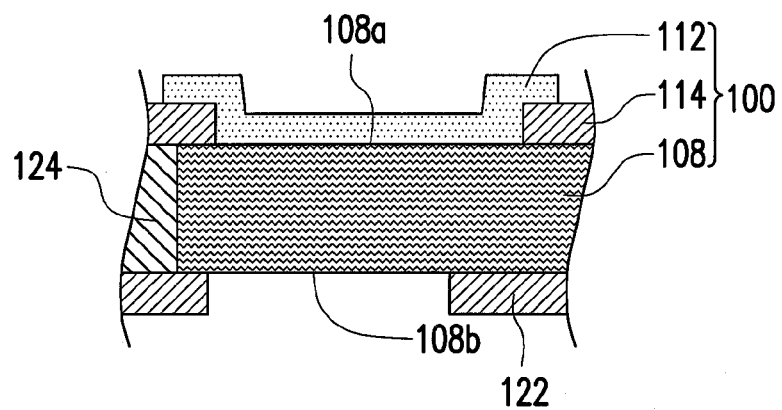
FIG. 2 is an enlarged view illustrating a portion II depicted in FIG. 1.

In FIG. 1A, an organic packaging carrier 100, a conductive cap 102, a sensor device 104, and a metal bonding material 106 are shown. The organic packaging carrier 100 is also shown in FIG. 2, which is an enlarged view illustrating a portion II depicted in FIG. 1A.

The organic packaging carrier 100 includes an organic substrate 108, a conductive circuit layer 110, and an inorganic hermetic insulation film 112. The organic substrate 108 has a first surface 108a and a second surface 108b. The conductive circuit layer 110 is located on the first surface 108a and exposes a portion of the first surface 108a. Besides, the conductive circuit layer 110 includes at least a conductive layer 114 and a sealing pad 116. The conductive layer 114 and the sealing pad 116 are basically in the same material layer, while the locations and the functions of the conductive layer 114 and the sealing pad 116 on the organic substrate 108 are different. The sensor device 104, for example, is a vibrator device, a sensing chip, and so on. The inorganic hermetic insulation film 112 at least covers the exposed first surface 108a to achieve an effect of completely hermetically sealing the organic packaging carrier 100.

In the disclosure, the so-called "inorganic hermetic insulation film" is made of a dense material capable of reducing the transmission rate of gas molecules, applying electrical insulation, and blocking moisture. For instance, the material of the inorganic hermetic insulation film 112 can be inorganic glass, ceramics, aluminum nitride, silicon oxide, aluminum oxide, and so forth. In addition, the inorganic hermetic insulation film 112 can be further extended and cover a portion of the conductive circuit layer 110, so as to ensure accomplishment of the hermetic sealing effect.

With reference to FIG. 1A, the conductive cap 102 covers the first surface 108a of the organic substrate 108 to achieve the effect of hermetically sealing the organic packaging carrier 100. Here, the conductive cap 102, for example, is a metal cap. The sensor device 104 is disposed within the hermetic space 118 and electrically coupled to the conductive layer 114 of the conductive circuit layer 110. For instance, when the sensor device 104 is the vibrator device, the sensor device 104 can be electrically connected to the conductive layer 114 of the conductive circuit layer 110 through a conductor 120. The conductor 120, for example, is a conductive adhesive (e.g. a silver adhesive). Besides, the organic substrate 108 and the conductive cap 102 are bonded together by the metal bonding material 106 disposed therebetween, and the metal bonding material 106, the sealing pad 116, and the conductive cap 102 can seal the hermetic space 118, so as to prevent gas from entering into or escaping from the hermetic space 118 through the space between the organic substrate 108 and the conductive cap 102. Here, the metal bonding material 106 includes pure metal or an alloy.

In the exemplary embodiment, the organic substrate 108 is, for example, a printed circuit board (PCB) reinforced by fiber or a flexible substrate, e.g. a polyimide (PI) substrate. It is optional to form circuits such as back wires 122 and conductive through holes 124 penetrating through the organic substrate 108 on the second surface 108b of the organic substrate 108. Nevertheless, the organic packaging carrier 100 of the disclosure is not limited to the PCB. As long as the inorganic hermetic insulation film 112 is formed to cover the first surface 108a of the organic substrate 108 exposed by the conductive circuit layer 110, the hermetically sealing effect can be accomplished. Given the surface of the organic substrate 108 is covered by a composite layer including an organic polymer material and an inorganic material, moisture may escape from a junction between the organic polymer material and the inorganic material to the hermetic space 118, and thereby the hermetic sealing effect cannot be achieved.

It should be noted that the same reference numerals in FIGS. 1B and 1A represent the same components. As indicated in FIG. 1B, the sensor device 104 is the sensing chip, and therefore the sensor device 104 can be electrically connected to the conductive layer 114 of the conductive circuit layer 110 through metal wires 126 (e.g. Au wires, Al wires, or Cu wires).

Figure 3:
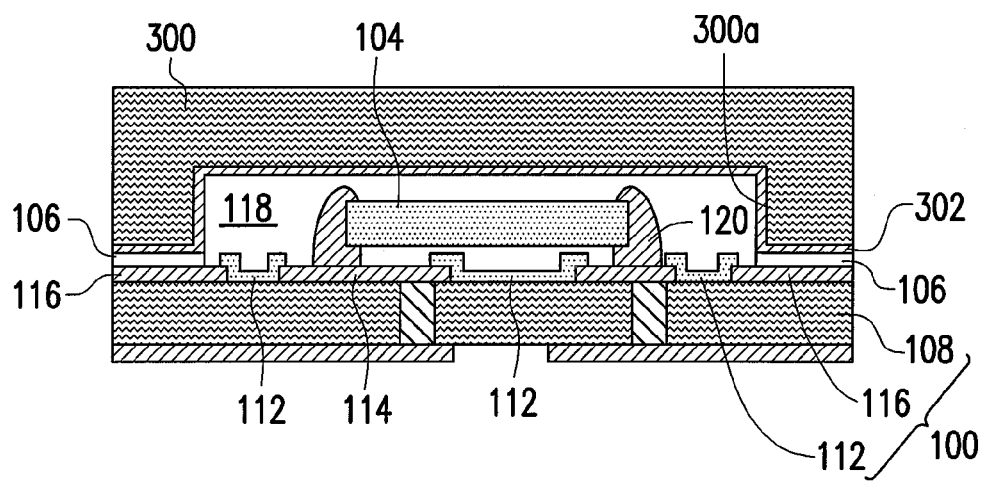
FIG. 3 is a schematic cross-sectional view illustrating a sensor device package according to a second exemplary embodiment of the disclosure.

FIG. 3 is a schematic cross-sectional view illustrating a sensor device package according to a second exemplary embodiment of the disclosure. It should be noted that the same reference numerals as in the first exemplary embodiment are used in FIG. 3 to represent the same components.

With reference to FIG. 3, the difference between the first exemplary embodiment and the second exemplary embodiment rests in that the conductive cap includes a cover substrate 300 and a metal coating layer 302 in the second exemplary embodiment. The cover substrate 300 has a recess 300a, and the cover substrate 300 and the organic packaging carrier 100 together form the hermetic space 118. The metal coating layer 302 at least covers a surface of the cover substrate 300, and the surface has the recess 300a. As such, gas cannot enter into or escape from the hermetic space 118 through the cover substrate 300. Here, a base material of the cover substrate 300 includes polymer, and the cover substrate 300, for example, is a PCB reinforced by fiber.

Figure 4:
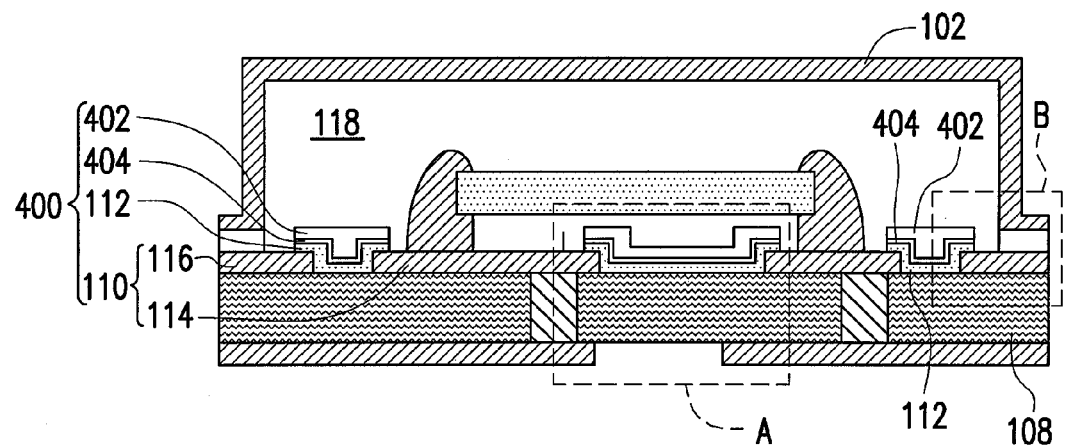
FIG. 4 a schematic cross-sectional view illustrating a sensor device package according to a third exemplary embodiment of the disclosure.

FIG. 4 is a schematic cross-sectional view illustrating a sensor device package according to a third exemplary embodiment of the disclosure. Note that the same reference numerals as in the first exemplary embodiment are used in FIG. 4 to represent the same components.

With reference to FIG. 4, the difference between the first exemplary embodiment and the third exemplary embodiment rests in that an organic packaging carrier 400 in the third exemplary embodiment further includes a metal reinforcement layer 402 located on a surface of the inorganic hermetic insulation film 112, so as to improve toughness of the inorganic hermetic insulation film 112. The metal reinforcement layer 402 itself is also conducive to accomplishment of the hermetic sealing effect. The metal reinforcement layer 402 does not come into contact with and is electrically insulated from the conductive circuit layer 110. Besides, a metal adhesive layer 404 (e.g. Ni/Au) can be formed between the inorganic hermetic insulation film 112 and the metal reinforcement layer 402 to enhance adhesion between the inorganic hermetic insulation film 112 and the metal reinforcement layer 402. The metal adhesive layer 404, the inorganic hermetic insulation film 112, and the metal reinforcement layer 402 can all block moisture.

The organic packaging carrier described in the previous exemplary embodiments not only can serve as the packaging carrier of the sensor device but also can be applied to other packages in compliance with the hermetic sealing requirement.

Figure 5A:
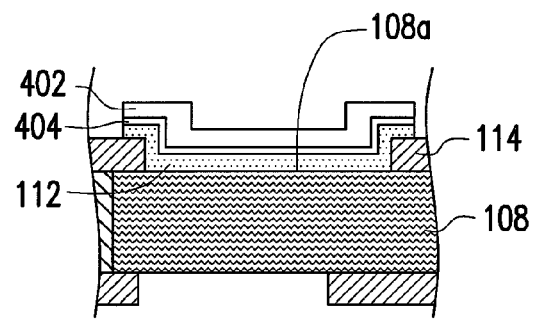
FIG. 5A and FIG. 5B are enlarged views respectively illustrating a portion A and a portion B depicted in FIG. 4.
Figure 5B:
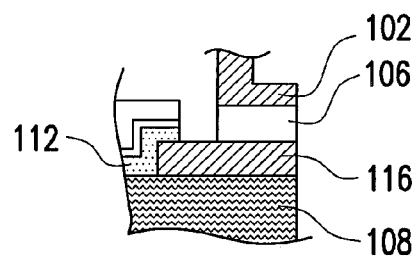

FIG. 5A and FIG. 5B are enlarged views respectively illustrating a portion A and a portion B depicted in FIG. 4. In FIG. 5A, the inorganic hermetic insulation film 112 is extended and covers a portion of the conductive layer 114, and the inorganic hermetic insulation film 112 is sandwiched between the metal reinforcement layer 402 and the conductive layer 114, so as to simultaneously accomplish the hermetic sealing effect and improve toughness. By contrast, in FIG. 5B, the inorganic hermetic insulation film 112 is extended and covers a portion of the sealing pad 116, and the organic substrate 108 and the conductive cap 102 are sealed by the metal bonding material 106, so as to prevent gas from entering into or escaping from the hermetic space through the space between the organic substrate 108 and the conductive cap 102.

Figure 6A:
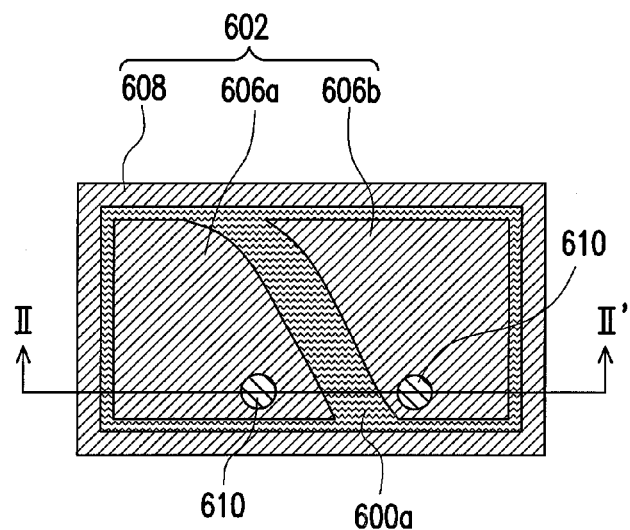
FIG. 6A to FIG. 6C are schematic views illustrating a process flowchart of fabricating an organic packaging carrier according to an exemplary embodiment of the disclosure.
Figure 6A:
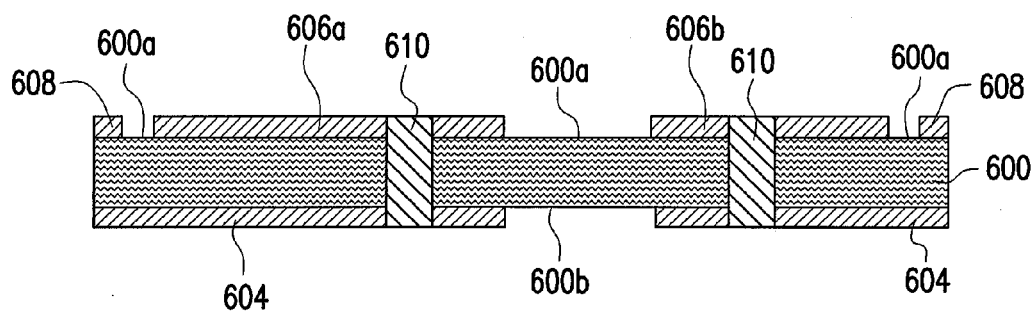
Figure 6B:
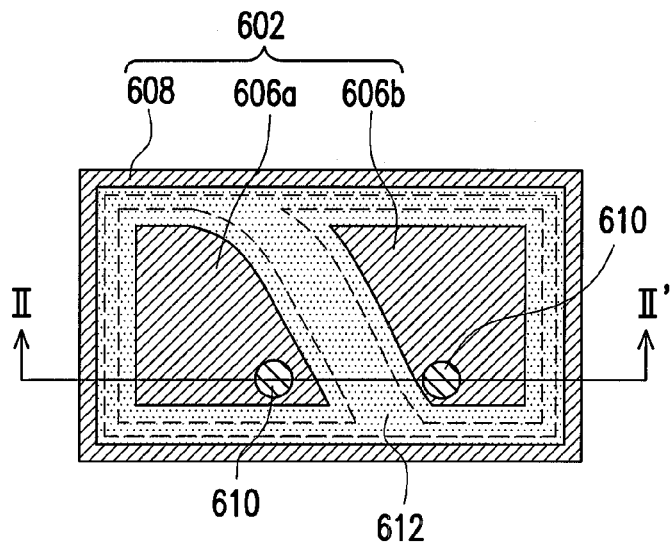
Figure 6B:
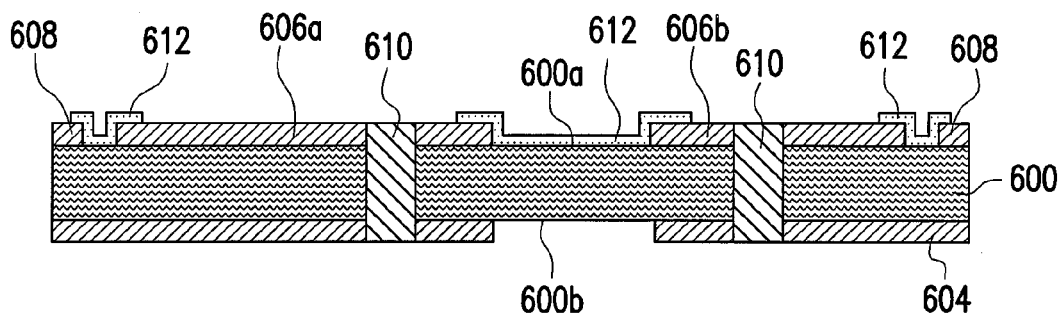
Figure 6C:
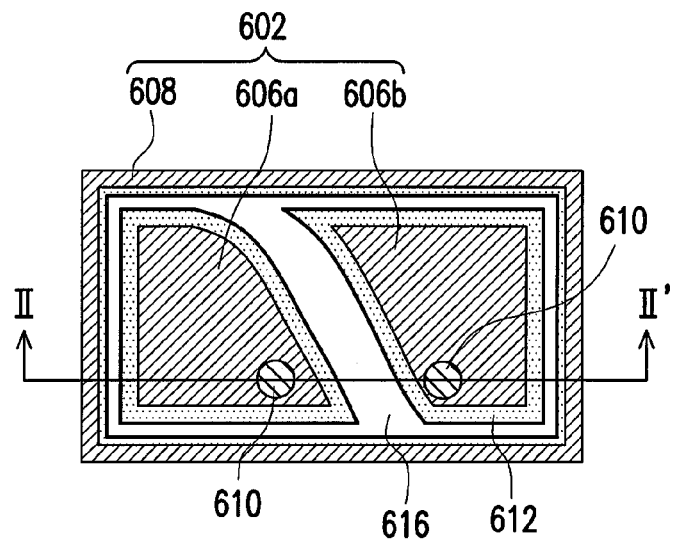
Figure 6C:
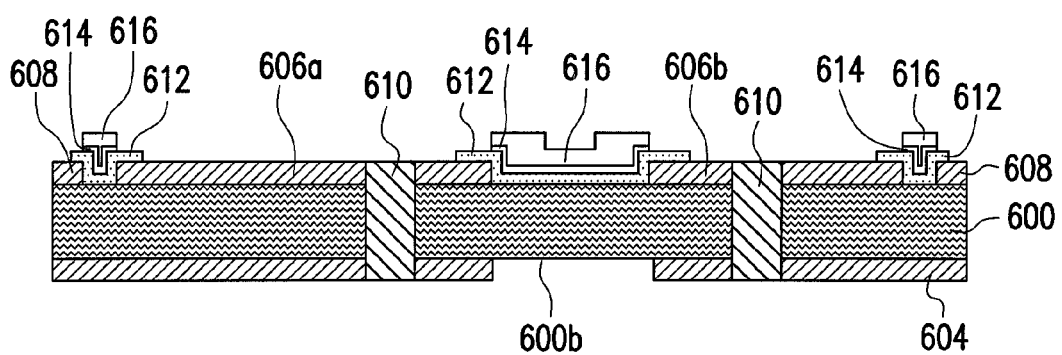

The afore-mentioned drawings are cross-sectional views, and the disclosure is further provided in detail with reference to FIG. 6A to FIG. 6C that are schematic views illustrating a process flowchart of fabricating an organic packaging carrier according to an exemplary embodiment of the disclosure. In FIG. 6A, the section (1) is a top view, and the section (2) is a cross-sectional view taken along a line II-II' depicted in the section (1). As indicated in FIG. 6A, conductive circuit layers 602 and 604 are respectively formed on a first surface 600a and a second surface 600b of the organic substrate 600, and a portion of the first surface 600a is exposed. Here, the conductive circuit layer 602 includes conductive layers 606a and 606b and a sealing pad 608. In addition, conductive through holes 610 can be formed in the organic substrate 600, such that the conductive circuit layers 602 and 604 are electrically coupled to each other. The conductive through holes 610 and the conductive circuit layer 604 on the second surface 600b of the organic substrate 600 are formed according to the circuit design and thus are not necessary components.

In FIG. 6B, the section (1) is a top view, and the section (2) is a cross-sectional view taken along a line II-II' depicted in the section (1). As indicated in FIG. 6B, an inorganic hermetic insulation film 612 is formed on the exposed first surface 600a. Besides, the inorganic hermetic insulation film 612 is extended and covers parts of the conductive layers 606a and 606b of the conductive circuit layer 602 and the sealing pad 608. A material of the inorganic hermetic insulation film 612 is described in the previous exemplary embodiments.

In FIG. 6C, the section (1) is a top view, and the section (2) is a cross-sectional view taken along a line II-II' depicted in the section (1). As shown in FIG. 6C, a metal adhesive layer 614 and a metal reinforcement layer 616 can be selectively formed on the inorganic hermetic insulation film 612 sequentially. Moreover, to ensure the metal reinforcement layer 616 and the metal adhesive layer 614 do not come into contact with the conductive circuit layer 602, a dimension of the metal reinforcement layer 616 and a dimension of the metal adhesive layer 614 can be slightly smaller than a dimension of the inorganic hermetic insulation film 612.

The detailed structure of the organic packaging carrier is elaborated with reference to the aforesaid process, while the aforesaid process poses no limitation to the fabrication process described in this disclosure.

Figure 7:
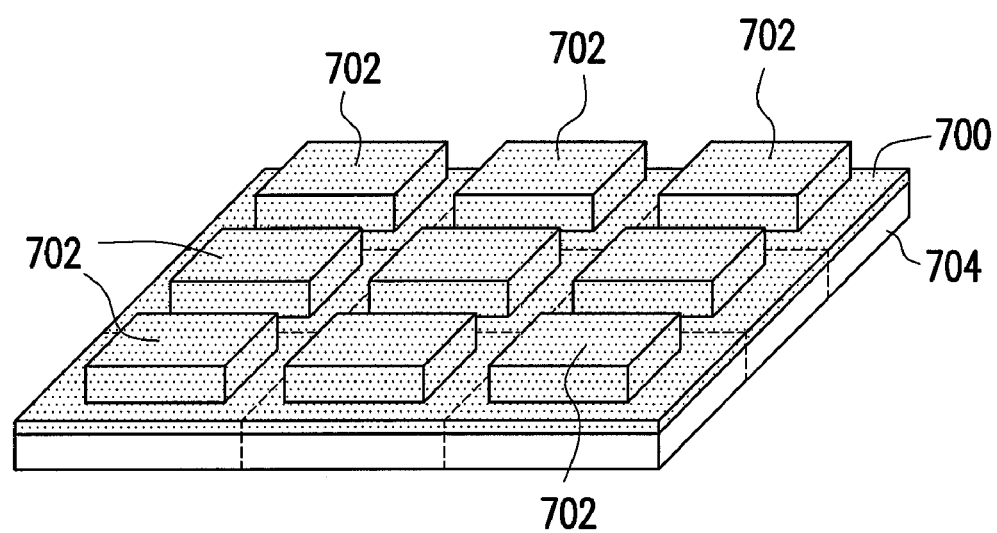
FIG. 7 is a three-dimensional simplified view illustrating mass production of a sensor device package according to an exemplary embodiment of the disclosure.

In addition, given the conductive cap described in the first or the third exemplary embodiment is a metal cap, a plurality of square caps 702 can be formed by exemplarily performing a pressing process on an entire metal piece 700, as shown in FIG. 7. A plurality of sensor devices (not shown) are then formed on the organic packaging carrier 704. After sealing, the entire metal piece 700 and the organic packaging carrier 704 can be cut off along the dashed lines in FIG. 7, such that the sensor device packages are directly formed. As exemplarily shown in FIG. 7, nine sensor device packages can be formed in a single manufacturing process. Hence, the manufacturing time of forming the sensor device packages through mass production can be significantly reduced in comparison with the manufacturing time of forming the conventional sensor device packages with use of ceramic substrates or glass substrates. To achieve the hermetic sealing effect, the cutting process should be performed on regions of the metal piece 700 which contain the metal bonding material and are located among the square caps 702. After the cutting process is carried out, the individual sensor device package is as shown in FIG. 1 or FIG. 4.

In light of the foregoing, since the organic substrate itself is not equipped with the gas-blocking function, the surface of the organic substrate exposed by the metal layer is covered by the hermetic insulation film, and therefore gas can be prevented from entering into the surface of the entire carrier. In addition, the metal reinforcement layer capable of improving toughness can also cover the hermetic insulation film. After the organic packaging carrier that can block entry of gas is formed, the sensor device package complying with the hermetic sealing requirement can be further formed.

Although the disclosure has been described with reference to the above exemplary embodiments, it will be apparent to one of the ordinary skill in the art that modifications to the described exemplary embodiments may be made without departing from the spirit of the disclosure. Accordingly, the scope of the disclosure will be defined by the attached claims not by the above detailed descriptions.

What is claimed is:

1. A sensor device package, comprising:
   an organic packaging carrier comprising:
      an organic substrate having a first surface;
      a conductive circuit layer, located on the first surface and exposing a portion of the first surface; and
      an inorganic hermetic insulation film, at least covering the exposed first surface to achieve an effect of hermetically sealing the organic packaging carrier;
   a conductive cap covering the first surface of the organic substrate to achieve the effect of hermetically sealing the organic packaging carrier and form a hermetic space;
   a sensor device disposed in the hermetic space and electrically coupled to the conductive circuit layer; and;
   a metal bonding material located between the organic substrate and the conductive cap to bond the organic substrate to the conductive cap.

2. The sensor device package as claimed in claim 1, wherein the organic packaging carrier further comprises:
   a metal reinforcement layer located on a surface of the inorganic hermetic insulation film to improve toughness of the inorganic hermetic insulation film and block moisture, wherein the metal reinforcement layer does not come into contact with the conductive circuit layer.

3. The sensor device package as claimed in claim 2, further comprising a metal adhesive layer located between the inorganic hermetic insulation film and the metal reinforcement layer.

4. The sensor device package as claimed in claim 2, wherein the inorganic hermetic insulation film is extended and covers a portion of the conductive circuit layer.

5. The sensor device package as claimed in claim 2, wherein the sensor device comprises a vibrator device or a sensing chip.

6. The sensor device package as claimed in claim 5, further comprising a plurality of metal wires to electrically couple the conductive circuit layer to the sensing chip.

7. The sensor device package as claimed in claim 5, further comprising at least a conductor to electrically couple the conductive circuit layer to the vibrator device.

8. The sensor device package as claimed in claim 2, wherein the conductive circuit layer comprises at least a conductive layer and a sealing pad.

9. The sensor device package as claimed in claim 8, wherein the metal bonding material is located between the conductive cap and the sealing pad on the organic substrate.

10. The sensor device package as claimed in claim 2, wherein a material of the inorganic hermetic insulation film comprises inorganic glass, ceramics, aluminum nitride, silicon oxide, or aluminum oxide.

11. The sensor device package as claimed in claim 2, wherein the organic substrate comprises a polyimide substrate or a printed circuit board reinforced by fiber.

12. The sensor device package as claimed in claim 2, wherein the conductive cap comprises a metal cap.

13. The sensor device package as claimed in claim 2, wherein the conductive cap comprises:
   a cover substrate having a recess, such that the cover substrate and the organic packaging carrier form the hermetic space; and
   a metal coating layer at least covering a surface of the cover substrate, the surface having the recess.

* * * * *